United States Patent
Park et al.

(12)

(10) Patent No.: US 6,214,710 B1
(45) Date of Patent: Apr. 10, 2001

(54) METHOD FOR A SEMICONDUCTOR DEVICE HAVING REDUCED CONTACT RESISTANCE AND LEAKAGE

(75) Inventors: Kyung-Ho Park, Dallas; Chih-Chen Cho, Richardson; Ming Jang Hwang, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/207,088

(22) Filed: Dec. 7, 1998

Related U.S. Application Data
(60) Provisional application No. 60/069,688, filed on Dec. 12, 1997.

(51) Int. Cl.[7] .................................................. H01L 21/3205
(52) U.S. Cl. .......................... 438/586; 438/651; 257/344
(58) Field of Search .................................... 438/586, 651, 438/694, 533, 269, 621, 733, 734, 735; 257/344, 384

(56) References Cited

U.S. PATENT DOCUMENTS

| | | | |
|---|---|---|---|
| 5,047,367 | 9/1991 | Wei et al. ............................. 437/200 |
| 5,567,652 | 10/1996 | Nishio ................................... 437/200 |
| 5,888,888 | * 3/1999 | Talwar et al. ......................... 438/533 |
| 6,020,239 | * 2/2000 | Gambino et al. ..................... 438/269 |
| 6,037,254 | * 3/2000 | Hong ..................................... 438/651 |
| 6,046,113 | * 4/2000 | Hong et al. ........................... 438/694 |
| 6,114,733 | * 9/2000 | Hong ..................................... 257/384 |

\* cited by examiner

*Primary Examiner*—David Nelms
*Assistant Examiner*—Phuc T. Dang
(74) *Attorney, Agent, or Firm*—David Denker; Wade James Brady, III; Frederick J. Telecky, Jr.

(57) ABSTRACT

A method of forming a semiconductor device includes separating a semiconductor gate body from the outer surface of the substrate by a gate insulator layer, forming a conductive drain region in the outer surface of the substrate and spaced apart from the gate conductor body, and forming a conductive source region in the outer surface of the substrate and spaced apart from the gate conductor body opposite the conductive drain region to define a channel region in the substrate disposed inwardly from the gate body and the gate insulator layer. The method also includes depositing a metal buffer layer over the conductive source region and conductive drain region, depositing a metal layer over the metal buffer layer, and reacting the metal layer and metal buffer layer with the conductive source region and conductive drain region to form respective first and second silicide regions.

12 Claims, 2 Drawing Sheets

METHOD FOR A SEMICONDUCTOR DEVICE HAVING REDUCED CONTACT RESISTANCE AND LEAKAGE

This application claims priority from provisional application No. 60/069,688, filed Dec. 12, 1997.

RELATED APPLICATIONS

This application is related to U.S. application Ser. No. 09/210,065, titled Apparatus and Method for Reducing Contact Resistance and Leakage for Contact Holes, filed Dec. 10, 1998.

TECHNICAL FIELD OF THE INVENTION

This invention relates generally to the field of electronic devices and more particularly to a semiconductor device having reduced contact resistance and leakage and method of construction.

BACKGROUND OF THE INVENTION

Semiconductor device fabrication often utilizes a salicide process. A salicide process is a self-aligned silicidation process. In a silicidation process, a metal, such as titanium, is placed into contact with silicon and heated. Heating of the titanium and silicon causes the silicon and titanium to combine to form a silicide compound. Silicidation is conventionally used to provide a conductive contact between silicon in a semiconductor device and a metal contact, which may be connected to a conductive lead. The resulting silicon-silicide-metal combination provides less contact resistance than provided with a direct metal-to-silicon contact. Large contact resistance is generally detrimental to the performance of a semiconductor device. A silicidation process is self-aligned, or a salicide process, when masking is not required to deposit the metal used to form the silicide compound.

A problem with the use of titanium in a silicide compound is that titanium silicide suffers from size effects. As the volume of a titanium silicide region in a semiconductor device decreases, its contact resistance increases. Thus, as semiconductor devices shrink, particularly the length of a gate in a semiconductor device, the use of titanium silicide may become unacceptable due to resulting high contact resistances. Because of the susceptibility to size effects of titanium silicide, cobalt and nickel are sometimes used as alternatives. In contrast to titanium silicide, cobalt silicide and nickel silicide do not suffer size effects and have a relatively constant resistance for varying volumes of the resulting silicide compound.

Although the use of cobalt or nickel in a silicidation process offers benefits over the use of titanium, their use is not without disadvantages. For example, the use of cobalt or nickel can result in current leakage into the silicon substrate. Such current leakage can be detrimental. In addition, the use of cobalt or nickel, although providing relatively constant contact resistance for varying volumes of silicide, has resulted in greater than expected contact resistances.

SUMMARY OF THE INVENTION

Accordingly, a need has arisen for a semiconductor device having reduced contact resistance and low leakage and method of construction for such a device. The present invention recognizes that current leakage arising from the use of cobalt or nickel in a silicidation process may be attributed to spiking of either cobalt or nickel into the silicon substrate. The present invention also recognizes that such spiking may be attributed to a rough interface between the cobalt silicide or the nickel silicide and the silicon substrate in a silicide process. The present invention additionally recognizes that the higher than expected contact resistances resulting from the use of either cobalt or nickel in the silicide process may be attributed to native oxide residing on the surface of the formed silicide. Such native oxide results in degradation of the contact formed in the silicide process. Such degradation results in higher than expected contact resistance.

The present invention provides a semiconductor device and method of construction that addresses shortcomings of prior devices and methods. According to one aspect of the invention, a method for constructing a semiconductor device includes separating a semiconductor gate body from the outer surface of the substrate by a gate insulator layer, forming a conductive drain region in the outer surface of the substrate and spaced apart from the gate conductor body, and forming a conductive source region in the outer surface of the substrate and spaced apart from the gate conductor body opposite the conductive drain region to define a channel region in the substrate disposed inwardly from the gate body and the gate insulator layer. The method also includes depositing a metal buffer layer over the conductive source region and conductive drain region, depositing a metal layer over the metal buffer layer, and reacting the metal layer and metal buffer layer with the conductive source region and conductive drain region to form respective first and second silicide regions.

According to another aspect of the invention, a semiconductor device includes a semiconductor gate body separated from the outer surface of the substrate by a gate insulator layer, a conductive drain region formed in the outer surface of the substrate and spaced apart from the gate conductor body, and a conductive source region formed in the outer surface of the substrate and spaced apart from the gate conductor body opposite the conductive drain region to define a channel region in the substrate disposed inwardly from the gate body and the gate insulator layer. The semiconductor device also includes a first silicide region overlying the conductive drain region, a second silicide region overlying the conductive source region. The first and second silicide regions comprise a silicide selected from the group consisting of $CoZr_ySi_x$, $CoHf_ySi_x$, $NiZr_ySi_x$, and $NiHf_ySi_x$, where "y" is less than one.

The invention provides several technical advantages. For example, one embodiment of the invention provides a method for constructing a semiconductor device that results in a device having reduced contact resistance and low leakage but that incorporates advantages associated with the use of cobalt or nickel to form silicide regions overlying portions of the semiconductor device. Such advantages include a relatively constant contact resistance for varying gate lengths, which is particularly important as device sizes shrink.

Other technical advantages will be readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIG. 1a through 11f are simplified cross-sectional views of a semiconductor structure in various states of fabrication according to one embodiment of the invention;

DETAILED DESCRIPTION OF INVENTION

Embodiments of the present invention and its advantages are best understood by referring to FIGS. 1a through 2e of the drawings, like numerals being used for like and corresponding parts of the various drawings.

Figure 1A:
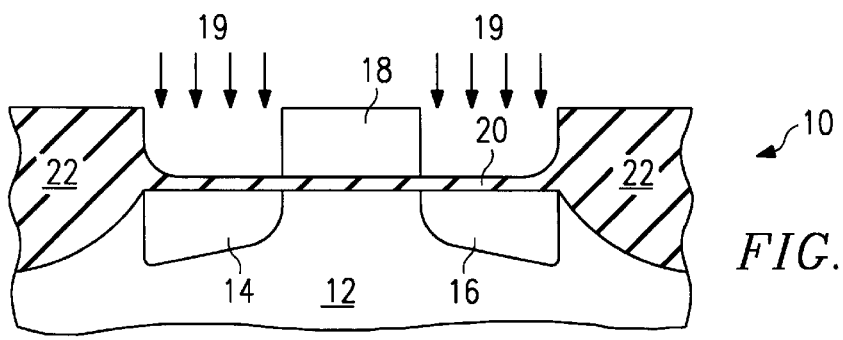

FIG. 1a illustrates a semiconductor device 10 during an initial state of construction after formation of a source region 14 and a drain region 16 in a substrate 12 and after formation of a gate body 18 overlying an oxide layer 20. Also illustrated in FIG. 1a are thick field oxide regions 22 utilized to isolate the resulting transistor from adjacent semiconductor devices. Source region 14, drain region 16, gate body 18, oxide layer 20, and field oxide regions 22 may be formed according to conventional techniques.

One example of a conventional technique for forming the semiconductor device 10 illustrated in FIG. 1a is described below. In this example, substrate 12 is a P-type silicon substrate; however, substrate 12 could be an N-type substrate. Thick field oxide regions 22 are formed by local oxidation of silicon using a process such as that shown in Havemann, et al. U.S. Pat. No. 4,541,167, issued Sept. 17, 1985 and assigned to the assignee of this application. Substrate 12 is then subjected to a thermal oxidation in a steam environment for approximately 7 minutes at a temperature of approximately 850° C. to form oxide layer 20 as shown in FIG. 1a. Oxide layer 20 may be grown to a thickness of approximately 3 to 10 nanometers, however, other thicknesses for oxide layer 20 may be used. A polysilicon layer is then deposited, patterned and etched using conventional photolithographic techniques to form polysilicon gate body 18. An example thickness of polysilicon gate body is approximately 400 nanometers. Appropriate ions 19 are then implanted, self-aligned to form source region 14 and drain region 16. For a P-type substrate, appropriate ions include phosphorous ions and arsenic ions. An example implantation includes implantation of arsenic ions at a density of approximately $3 \times 10^5$ ions per square centimeter and an energy of approximately 150 kiloelectron volts. A second ion implantation of phosphorous ions having a density of approximately $4 \times 10^{14}$ ions per square centimeter and an energy level of approximately 85 kiloelectron volts may also be incorporated.

A channel region is defined within substrate 12 between source region 14 and drain region 16. Although particular details of one example of the formation of source region 12, drain region 14, gate body 18, oxide layer 20, and field oxide regions 22 have been provided, other methods and techniques may be utilized without departing from the scope of the present invention.

Figure 1B:
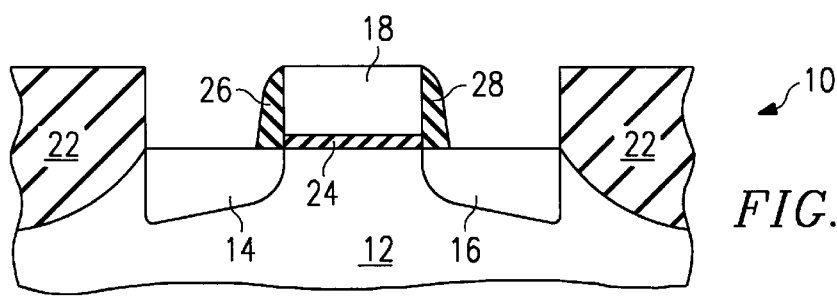

FIG. 1b illustrates semiconductor device 10 after formation of a gate oxide layer 24 and sidewall spacers 26 and 28. Gate oxide layer 24 is formed by patterning and etching oxide layer 20 using conventional photolithographic techniques. Sidewall spacers 26 and 28 provide separation between a silicide that will be formed over source and drain regions 14, 16 and gate body 18, which is conductive. Sidewall spacers 26 and 28 may be formed, for example, by depositing a conformal layer of TEOS oxide over semiconductor device 10 and anisotropically etching the TEOS oxide layer, leaving sidewall spacers 26 and 28. Sidewall spacers 26 and 28 may alternatively be formed prior to implantation of ions 19 to form source region 14 and drain region 16.

Figure 1C:
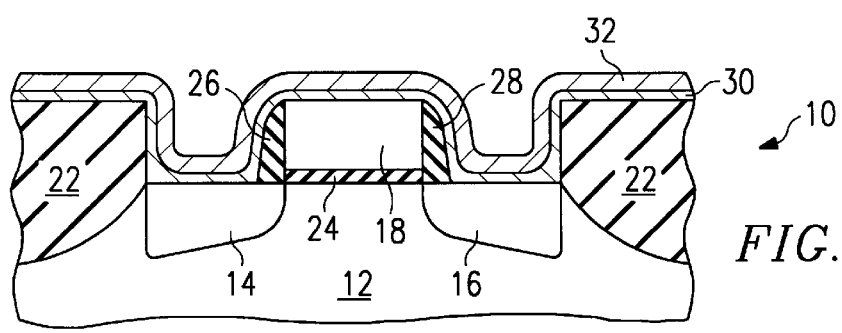

FIG. 1c illustrates the deposition of a thin buffer layer 30 of metal. Thin buffer layer 30 will act as a buffer layer between silicon in source region 12, drain region 14, and gate body 18 and a metal layer during formation of silicide regions in semiconductor device 10. As described in greater detail below, zirconium and hafnium are both particularly suitable metals for thin buffer layer 30; however, other suitable metals may be used without departing from the teachings of the present invention. Thin buffer layer 30 is deposited outwardly from semiconductor device 10 to a thickness of approximately 1 to 5 nanometers. Thin buffer layer 30 resists spiking during the formation of a silicide and also contributes to low contact resistance between a resulting silicide and a metal contact. Although particular thicknesses for thin buffer layer 30 have been described, other thicknesses for thin buffer layer 30 may be utilized. However, thin buffer layer 30 should be sufficiently thin to prevent the formation of a second silicide layer in addition to a silicide layer formed primarily from a metal layer 32.

Metal layer 32 is illustrated disposed outwardly over thin buffer layer 30. Metal layer 32 is provided for reaction with silicon in source region 14, drain region 16, and gate body 18 to produce silicide regions for establishing an electrical connection with metal contacts. Such silicide regions provide lower contact resistance between a metal contact and the silicon in source region 14, drain region 16, or gate body 18 than would occur with a direct contact between a metal contact and the silicon in source region 14, drain region 16, or gate body 18. Metal layer 32 may be formed from any suitable metal that is a different metal from that used for thin buffer layer 30; however, cobalt and nickel are both particularly advantageous metals for use in metal layer 32. Both cobalt silicide and nickel silicide do not suffer size effects traditionally associated with the use of titanium to form a silicide compound. Therefore, the use of such materials allows for reduced contact resistances, which are particularly important as the size of semiconductor devices decrease. Metal layer 32 is deposited to a thickness in the range of 5 nanometers to 40 nanometers; however, other thicknesses for layer 32 may be used without departing from the scope of the present invention.

Figure 1D:
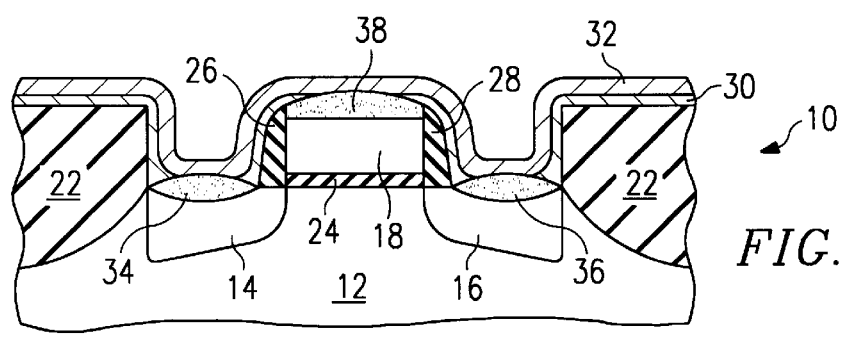

FIG. 1d illustrates semiconductor device 10 after reaction of metal layer 32 with thin buffer layer 30 and the silicon in source region 14, drain region 16, and gate body 18. Due to the reaction of these materials, a silicide region 34 is formed overlying source region 14, and a silicide region 36 is formed overlying drain region 16. In addition, a silicide region 38 is formed overlying gate body 18. Silicide regions 34, 36, and 38 are formed by heating of semiconductor device 10 such that the metal in metal layer 32 may react with the silicon in source region 14, drain region 16, and gate body 18, as well as the metal in thin buffer layer 30 to form a silicide. According to one embodiment, such an anneal occurs at a temperature in the range of 450° C. to 850° C. for a time period of 10 seconds to 100 seconds. In addition to this anneal, a second anneal could be performed with similar temperature and time conditions to cause further reaction of the materials.

Because different metals are used within metal layer 32 and thin buffer layer 30, a silicide compound is formed within silicide regions 34, 36, and 38 incorporating each metal. With thin buffer layer 30 being thinner than metal layer 32, the metal in metal layer 32 will form a majority silicide within silicide regions 34, 36, and 38 and the metal within thin buffer layer 30 will form a minority silicide within silicide regions 34, 36, and 38. An example of the resulting compound in silicide regions 34, 36, and 38 formed according to the teachings of the present invention is $CoZr_ySi_x$, where "x" represents the ratio of silicon atoms to cobalt atoms and "y" is less than one and represents the ratio of zirconium atoms to cobalt atoms. Other examples of compounds comprising silicide regions 34, 36, and 38 include $CoHf_ySi_x$, $NiZr_ySi_x$, and $NiHf_ySi_x$, where "x" represents the ratio of silicon atoms to either cobalt or nickel atoms and "y" is less than one and represents the ratio of either the number of hafnium atoms or zirconium atoms to the number of cobalt or nickel atoms.

Figure 1E:
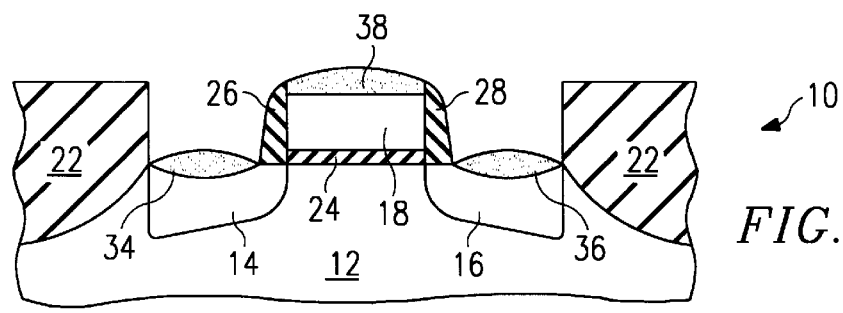

FIG. 1e illustrates semiconductor device 10 after additional processing steps associated with removing thin buffer layer 30 and metal layer 32. After formation of silicide regions 34, 36, and 38, the unreacted metals in metal layer 32 and thin buffer layer 30 may be selectively removed through the use of an etchant that does not attack the silicide in silicide regions 34, 36, and 38, silicon substrate 12, or field oxide regions 22. An example of such an etchant is a mixture of $H_2O_2$ and $H_2SO_4$.

Figure 1F:
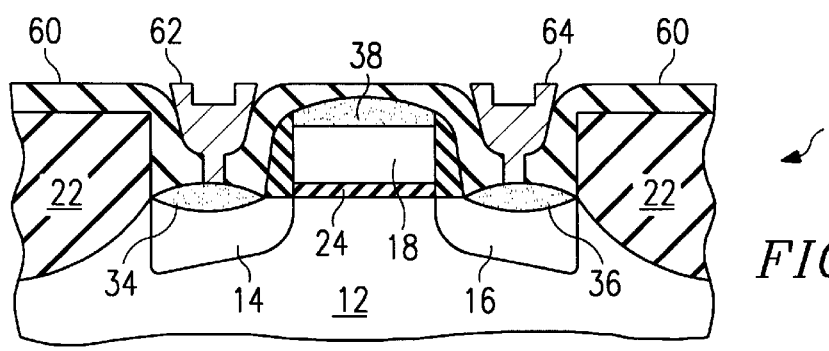

FIG. 1f illustrates semiconductor device 10 after formation of metal contacts 62 and 64. After etching of metal layer 32 and thin buffer layer 30, a dielectric layer 60 is deposited. Contact holes are then opened to expose portions of silicide regions 34 and 36 overlying source region 14 and drain region 16, respectively. An example method for exposing portions of silicide regions 34 and 36 is photolithographic masking and etching. After exposing portions of silicide regions 34 and 36, metal is deposited into the contact holes to form metal contacts 62 and 64. Metal contacts 62 and 64 therefore provide a conductive path to source region 14 and drain region 16. A metal contact may also be formed for connection to silicide region 38.

The use of a thin buffer layer 30 provides several benefits. First, if zirconium or hafnium is used, because zirconium oxide and hafnium oxide both have high heats of formation, zirconium and hafnium are good oxide reduction materials. For example, zirconium oxide has a heat of formation of approximately −360 kJ/mole and hafnium oxide has a heat of formation of approximately −380 kJ/mole. By comparison, silicon dioxide has a heat of formation of approximately −300 kJ/mole. Because zirconium and hafnium are good oxide reduction materials, native oxide formed on the surface of the resulting silicide in silicide regions 34, 36, and 38 is reduced. Reduction of native oxide on the surface silicide regions 34, 36, and 38 eliminates the problem of higher than expected contact resistance due to native oxide formation.

Furthermore, as described in greater detail in conjunction with FIGS. 2a through 2d, the use of thin buffer layer 30 provides a smooth interface of the resulting silicide with the underlying silicon, such as the silicon in drain region 14, source region 16, and gate region 18. Because these interfaces are smooth, the likelihood of spiking is reduced, and therefore current leakage is reduced. Providing of a smooth interface of silicide regions 34, 36, and 38 with the underlying silicon is described in greater detail in conjunction with FIGS. 2a though 2e.

Figure 2A:
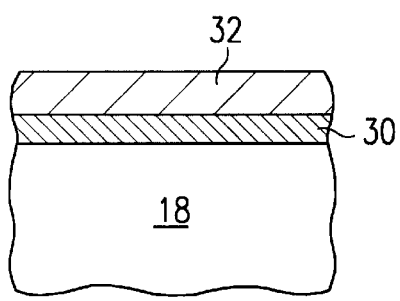
FIGS. 2a through 2d are simplified cross-sectional views of portions of FIGS. 1a through 1f, illustrating formation of a silicide region according to the teachings of the invention.

FIG. 2a illustrates an enlarged view of gate body 18, which is formed from silicon. Overlying gate body 18 is thin buffer layer 30. For simplicity of description, thin buffer layer 30 is assumed to comprise hafnium in FIGS. 2a through 2d. Overlying thin buffer layer 30 is metal layer 32. Also for simplicity of description, metal layer 32 is assumed to comprise cobalt in FIGS. 2a through 2d. Silicon in gate body 18 reacts with cobalt in metal layer 32 and hafnium in thin buffer layer 30 to produce silicide region 38. Thin layer 30 of hafnium provides beneficial properties for the resulting silicide region 38, as described below. The below description is also applicable to formation of silicide regions 34 and 36 overlying source region 14 and drain region 16.

Figure 2B:
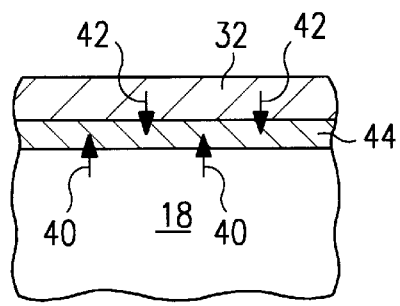

FIG. 2b, illustrates the diffusion of silicon atoms, represented by arrows 40, into metal layer 32 and the diffusion of the cobalt atoms, represented by arrows 42, into gate body 18. Conventionally, a silicidation process forms a rough silicide layer such as silicide layer 152 illustrated in FIG. 2e. However, thin layer 30 provides a diffusion buffer between the silicon in gate body 18 and the cobalt in metal layer 32 to prevent the formation of a rough silicide layer. The prevention of such a rough silicide layer resists spiking, which could otherwise result in current leakage.

Silicon atoms 40 diffuse toward metal layer 32 and cobalt atoms 42 diffuse toward gate body 18 in response to an annealing step. An example anneal is a rapid thermal anneal having a temperature range of 450° C. to 850° C. and a duration of 10 seconds to 100 seconds. As silicon atoms 40 and cobalt atoms 42 begin to diffuse, thin buffer layer 30 transforms into an amorphous layer 44 of, in this example, hafnium, cobalt, and silicon.

Figure 2C:
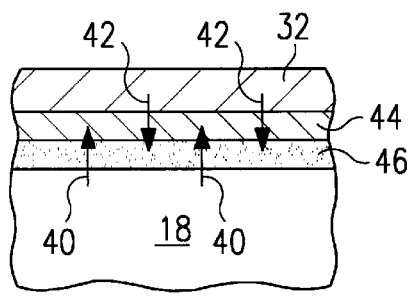

FIG. 2c illustrates the formation of a smooth silicide layer 46 of cobalt silicide during the above-described annealing step. Because the rate of diffusion along a grain boundary within a polycrystalline material, such as the silicon in gate body 18 is different than diffusion within a single grain of material within a polycrystalline material, diffusion through a polycrystalline material tends to form a rough interface, such as interface 154 illustrated in FIG. 2e. In contrast, an amorphous material has no grain boundary, therefore the rate of diffusion within an amorphous material, such as layer 44, is more uniform. Thus, forming amorphous layer 44 before the formation of layers 46 and 52 which have a polycrystalline structure, makes a resulting interface 54 smooth. As annealing continues, additional silicon atoms 40 and cobalt atoms 42 diffuse into amorphous layer 44 to form a silicide. As annealing continues, hafnium silicide becomes a minority silicide and cobalt silicide becomes a majority silicide within a uniform and smooth polycrystalline silicide layer 52 formed between the silicon gate body 18 and metal layer 32. The resulting structure is illustrated in FIG. 2d.

Figure 2D:
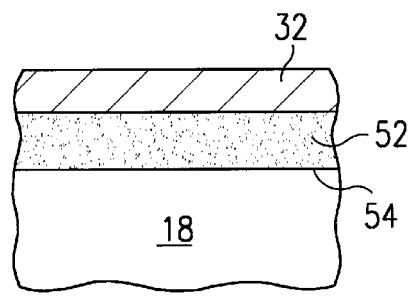

The resulting structure in FIG. 2d provides an interface 54 between gate body 18 and silicide layer 52 that is smooth enough to eliminate leakage due to spiking of silicide into gate body 18. Therefore, the use of thin buffer layer 30 in combination with metal layer 32 results in a structure that does not suffer leakage problems due to a rough interface between the silicide and the silicon. Such rough interfaces are conventionally found in silicide processes utilizing cobalt or nickel.

Figure 2E:
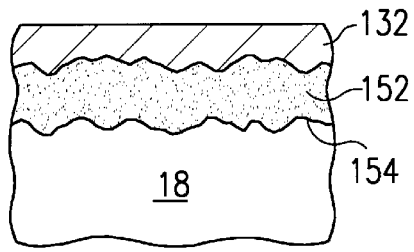
FIG. 2e is a simplified cross-sectional view of a portion of a semiconductor device showing formation of a silicide region according to conventional techniques.

FIG. 2e depicts a rough interface 154 that may be formed in a silicide process not incorporating a thin buffer layer, such as thin buffer layer 30. As illustrated, a rough silicide layer 152 is disposed between a metal layer 132 and a gate body, such as gate body 18. Rough interface 154 is formed between gate body 18 and silicide layer 152, which could lead to spiking and leakage. Such spiking is avoided in the above-described process incorporating the teachings of the present invention.

Although the present invention and its advantages have been described in detail, it should be understood that various changes, substitutions, and alterations can be made therein without departing from the spirit and scope of the present invention as defined by the appended claims.

What is claimed is:

1. A method of forming a semiconductor device in the surface of a substrate, the method comprising the steps of:

separating a semiconductor gate body from the outer surface of the substrate by a gate insulator layer;

forming a conductive drain region in the outer surface of the substrate and spaced apart from the gate body;

forming a conductive source region in the outer surface of the substrate and spaced apart from the gate body opposite the conductive drain region to define a channel region in the substrate disposed inwardly from the gate body and the gate insulator layer;

depositing a metal buffer layer over the conductive source region and conductive drain region, the metal buffer layer comprising a metal selected from the group consisting of zirconium and hafnium;

depositing a metal layer over the metal buffer layer; and reacting the metal layer and metal buffer layer with the conductive source region and conductive drain region to form respective first and second silicide regions.

2. The method of claim 1, wherein the step of depositing a metal layer over the metal buffer layer comprises depositing a metal layer comprising a metal selected from the group consisting of cobalt and nickel.

3. The method of claim 1, wherein the step of reacting the metal layer and metal buffer layer with the conductive source region and conductive drain region comprises annealing the metal layer, metal buffer layer, conductive source region, and conductive drain region.

4. The method of claim 3, wherein the step of annealing comprises annealing at a temperature in the range of 450 degrees Centigrade to 850 degrees Centigrade for a time period in the range of 10 seconds to 100 seconds.

5. The method of claim 1, wherein the step of depositing a metal buffer layer further comprises depositing a metal buffer layer consisting essentially of zirconium.

6. The method of claim 1, wherein the step of depositing a metal buffer layer further comprises depositing a metal buffer layer consisting essentially of hafnium.

7. The method of claim 1, wherein the step of depositing a metal buffer layer further comprises depositing a metal buffer layer having a thickness in the range of 1 to 5 nanometers.

8. The method of claim 1, wherein the step of depositing a metal buffer layer over the conductive source region and conductive drain region further comprises depositing the metal buffer layer over the gate body and further comprising reacting the metal layer and metal buffer layer with the gate body.

9. The method of claim 1, wherein the step of depositing a metal layer over the metal buffer layer comprises depositing a metal layer consisting essentially of cobalt.

10. The method of claim 1, wherein the step of depositing a metal layer over the metal buffer layer comprises depositing a metal layer consisting essentially of nickel.

11. The method of claim 7, wherein the step of depositing a metal layer further comprises depositing a metal layer having a thickness in the range of 5 to 40 nanometers.

12. A method of forming a semiconductor device in the surface of a substrate, the method comprising the steps of:

separating a semiconductor gate body from the outer surface of the substrate by a gate insulator layer;

forming a conductive drain region in the outer surface of the substrate and spaced apart from the gate body;

forming a conductive source region in the outer surface of the substrate and spaced apart from the gate body opposite the conductive drain region to define a channel region in the substrate disposed inwardly from the gate body and the gate insulator layer;

depositing a buffer layer overlying the conductive source region, conductive drain region, and gate body, the buffer layer consisting essentially of a metal selected from the group consisting of hafnium and zirconium, the buffer layer having a thickness in the range of 1 to 5 nanometers;

depositing a metal layer overlying the buffer layer, the metal layer consisting essentially of a metal selected from the group consisting of cobalt and nickel, the metal layer having of a thickness in the range of 5 to 40 nanometers; and annealing the metal layer, buffer layer, conductive source region, conductive drain region, and gate body to form respective first, second, and third silicide regions, the first, second a third silicide regions each comprising a silicide selected from the group consisting of $CoZr_ySi_x$, $CoHf_ySi_x$, $NiZr_ySi_x$, and $NiHf_ySi_x$, where "y" is less than one.

* * * * *